United States Patent
Arnold et al.

(10) Patent No.: US 6,884,676 B2
(45) Date of Patent: Apr. 26, 2005

(54) VERTICAL 8F2 CELL DRAM WITH ACTIVE AREA SELF-ALIGNED TO BIT LINE

(75) Inventors: Norbert Arnold, Chestnut Ridge, NY (US); Venkatachalam C. Jaiprakash, Sunnyvale, CA (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/447,065

(22) Filed: May 28, 2003

(65) Prior Publication Data

US 2004/0238868 A1 Dec. 2, 2004

(51) Int. Cl.$^7$ .......................... H01L 21/8242
(52) U.S. Cl. ............................................. 438/243
(58) Field of Search ........................ 438/239, 243, 438/363

(56) References Cited

U.S. PATENT DOCUMENTS

| | | | |
|---|---|---|---|
| 6,153,902 A | 11/2000 | Furukawa et al. | |
| 6,163,045 A | 12/2000 | Mandelman et al. | |
| 6,339,241 B1 | 1/2002 | Mandelman et al. | |
| 6,376,324 B1 | 4/2002 | Mandelman et al. | |
| 6,406,970 B1 | 6/2002 | Kudelka et al. | |
| 6,429,068 B1 | 8/2002 | Divakaruni et al. | |
| 6,437,401 B1 | 8/2002 | Mandelman et al. | |
| 6,458,647 B1 | 10/2002 | Tews et al. | |
| 6,645,839 B2 * | 11/2003 | Haupt et al. | 438/542 |
| 6,767,789 B1 * | 7/2004 | Bronner et al. | 438/254 |
| 6,781,180 B1 * | 8/2004 | Martin et al. | 257/301 |

* cited by examiner

Primary Examiner—Chandra Chaudhari
Assistant Examiner—David S. Blum
(74) Attorney, Agent, or Firm—Lerner, David, Littenberg, Krumholz & Mentlik, LLP

(57) ABSTRACT

A memory cell is formed in a memory cell array comprised of a plurality of memory cells arranged in rows and columns. A deep trench structure is formed within a semiconductor substrate and includes at least one conducting region. A patterned bit line structure is formed atop of, and electrically isolated from, the insulating region of the deep trench structure and atop of, but contacting at least part of, regions of the semiconductor substrate. Exposed portions of the semiconductor substrate are etched to form at least one isolation trench adjoining the deep trench structure using the patterned bit line structure as an etch mask. The isolation trench is filled with a dielectric material. A contact region to the conducting region of the deep trench structure is formed within the dielectric material of the isolation trench and is electrically isolated from the bit line structure. A word line structure that connects to the contact region is formed and is at least partly atop of, but electrically isolated from, the bit line structure.

22 Claims, 21 Drawing Sheets

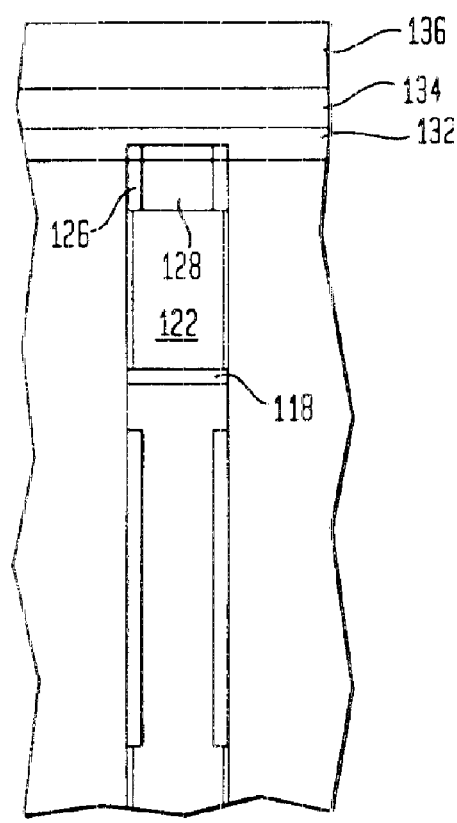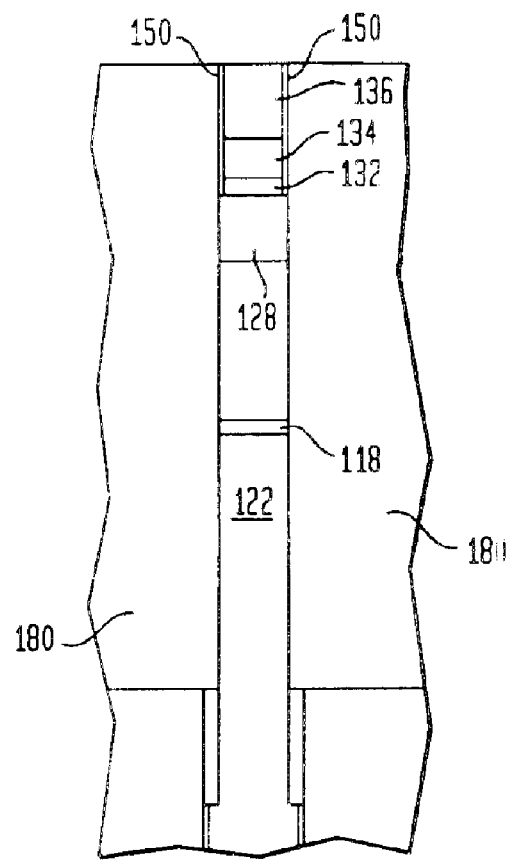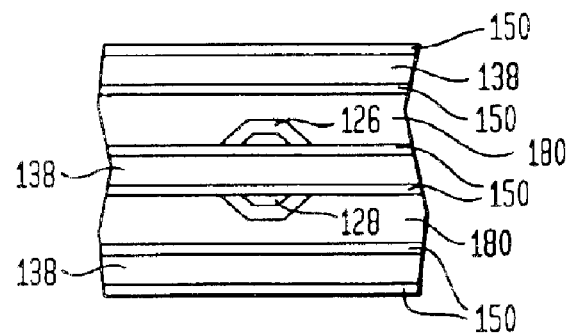

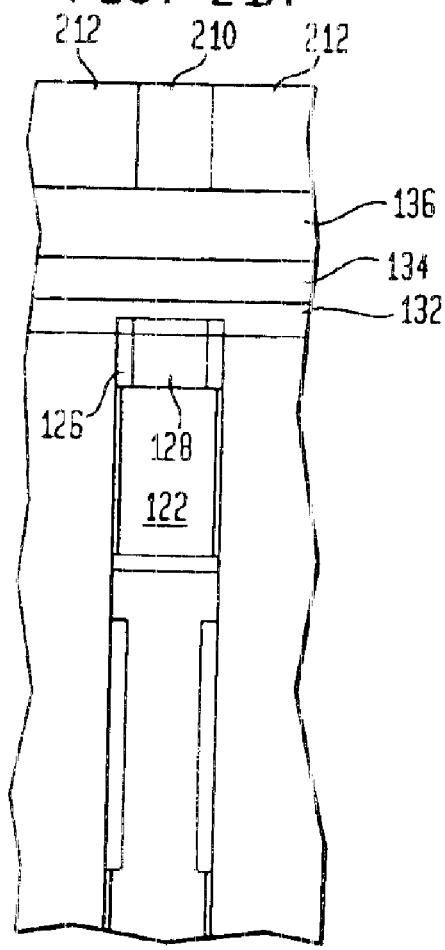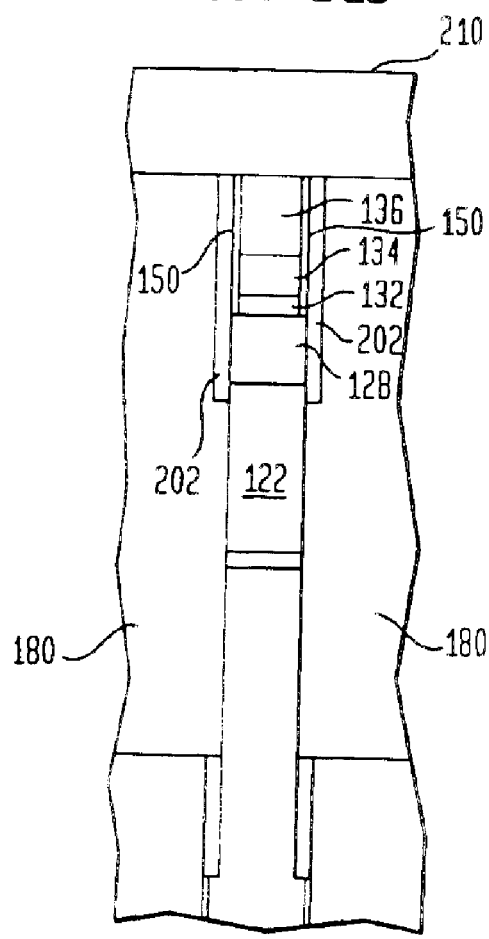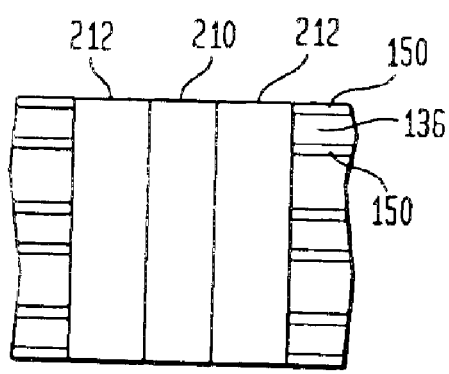

VERTICAL 8F2 CELL DRAM WITH ACTIVE AREA SELF-ALIGNED TO BIT LINE

BACKGROUND OF THE INVENTION

The present invention is directed to memory devices and, more particularly, to dynamic random access memory (DRAM) structures formed in a substrate.

Dynamic random access memory devices (DRAMs) typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier connected to the bit line pair senses and amplifies the potential difference and transfers the data from the selected memory cells to a data line pair.

An advantage of DRAMs over other types of memory technology is their low cost because of the simplicity and scaling characteristics of the memory cell. Though the DRAM memory cell is based on simple concepts, the actual design and implementation of such cells typically requires a highly complex DRAM design and process technology.

An example of current DRAM technology is a buried capacitor DRAM memory in which memory bits are constructed in pairs to allow sharing of a bit line contact. The sharing of the bit line contact significantly reduces the overall cell size. Typically, the memory bit pair includes an active area (AA), a pair of word lines, a bit line contact, a metal or polysilicon bit line, and a pair of cell capacitors.

The bit line pitch, i.e., the width of the bit line plus the distance between adjacent bit lines, typically determines the active area pitch and the capacitor pitch. The active area width is typically adjusted to maximize the transistor drive and minimize the transistor-to-transistor leakage.

The word line pitch typically determines the space available for the bit line contact, the transistor length, the active area space, and the capacitor length. Each of these dimensions must be optimized to maximize device capacitance, minimize device leakage and maximize process yield.

A common memory bit is known as an eight square feature or 8F2 cell. By definition, the feature size is the minimum realizable dimension for a given process. In practice, however, the feature size is one-half of the word line (row) pitch or bit line (column) pitch. As an example, a 0.3 $\mu$m process having word line and bit line pitches of 0.6 $\mu$m typically provides a memory bit size that is $8 \cdot (0.3 \mu m)^2 = 0.72 \mu m^2$. The 8F2 designation is best explained by traversing along the outer boundary of a memory cell. Traversing along one axis, the path includes one-half of a bit line contact feature, one word line feature, one capacitor feature, one field polysilicon feature, and one-half of a polysilicon space feature, for a total of 4 feature lengths. Along another axis that is perpendicular thereto, the path includes two one-half field oxide features and one active area feature for a total of two feature lengths. The area of the memory bit is therefore $4F \cdot 2F = 8F^2$, also referred to as 8F2.

The folded array architecture always produces an 8F2 memory bit because each word line connects, namely forms a crosspoint, with a memory bit transistor on every other bit line and passes around the memory bit transistors as a field polysilicon layer on the remaining bit lines. The field polysilicon layer in each memory bit cell adds two square features to what otherwise is a 6F2 cell. Though the folded array yields a cell that is 25% larger than the 6F2 array architectures, the folded array results in superior signal-to-noise performance, especially when combined with bit line folding.

As memory devices become increasingly smaller, the width of the deep trench which forms part of the vertical transistor and the capacitor must be made smaller to accommodate the passing word line and the bit line contacts. However, the deep trench cannot be made too small or the trench cannot be filled properly without the presence of voids. As a result, the etch step that forms the deep trench becomes increasingly difficult to control within desired specifications.

Moreover, as these devices become smaller, the trench collar oxide layer that is located along the sidewalls of the deep trenches cannot be formed using existing localized oxidation of silicon (LOCOS) processes and must be formed, instead, by a buried collar or other costly process steps.

Additionally, with such devices, voids may be present in the high-density plasma (HDP) deposited oxide or other dielectrics that are typically used to fill the isolation trenches. Such voids may be present at "triple point" corners where the isolation trench, the silicon substrate and the polysilicon layers meet.

Further, two bit line contacts are typically present for each deep trench, resulting in a significant increase in the bit line capacitance.

It is therefore desirable to provide a DRAM structure and fabrication process that avoids these problems.

SUMMARY OF THE INVENTION

The present invention provides a 8F2 vertical DRAM cell in which the bit line structure is formed prior to the etching of the isolation trench and the formation of the word line structure, and the bit line structure is then used to mask the etching of the isolation trench so that the active area is self-aligned to the bit line, thereby increasing the space available for the deep trench region.

In accordance with an aspect of the invention, a memory cell in a memory cell array comprised of a plurality of memory cells arranged in rows and columns is formed. A deep trench structure is formed within a semiconductor substrate, and the deep trench structure includes at least one conducting region. A patterned bit line structure is formed atop of, and electrically isolated from, the conducting region of the deep trench structure and atop of, but contacting at least part of, the regions of the semiconductor substrate. Exposed portions of the semiconductor substrate are etched to form at least one isolation trench adjoining the deep trench structure using the patterned bit line structure as an etch mask. The isolation trench is filled with a dielectric material. A contact region to the conducting region of the deep trench structure is formed within the dielectric material of the isolation trench and is electrically isolated from the bit line structure. A word line structure that connects to the contact region is formed and is at least partly atop of, but electrically isolated from, the bit line structure.

According to another aspect of the invention, a memory cell of a memory cell array comprised of a plurality of the memory cells arranged in rows and columns is formed. A deep trench region is formed within a semiconductor substrate. A buried plate region is formed within the semiconductor substrate adjacent to the deep trench region. A dielectric film is formed along the sidewalls of the deep trench region. An upper region of the dielectric film is removed such that a trench collar is formed along a middle portion of the deep trench region. The deep trench region is filled with doped polysilicon up to and partially above the trench collar. A trench top oxide layer is formed atop the doped polysilicon, and a gate dielectric layer is formed on a further portion of the sidewalls of the deep trench region. A further portion of the deep trench region that is atop the trench top oxide layer is filled with a further region of doped polysilicon, and a remaining portion of the deep trench region is filled with at least one dielectric material. A doped region is formed in an upper portion of the semiconductor substrate adjacent to the deep trench. At least one conductive layer is deposited atop the semiconductor substrate and atop the dielectric material in the deep trench. The conductive layer is patterned and etched to form at least one bit line structure that is atop of the dielectric material in the deep trench region and that is atop of, but contacting at least part of, the regions of the semiconductor substrate. Electrically insulating sidewall spacers are formed on the sidewalls of the bit line structure. Exposed portions of the semiconductor substrate are etched to form at least one isolation trench adjoining the deep trench structure using the patterned bit line structure and using the dielectric material of the deep trench region as an etch mask. The isolation trench is filled with a further dielectric material. A portion of the further dielectric material is patterned and etched to form a contact opening to the further polysilicon region of the deep trench region, and the contact openings are filled with a conducting material to form a contact region that is electrically isolated from the bit line structure by the sidewall spacers. At least one dielectric layer is deposited atop the bit line structure, the top surface of the dielectric layer is planarized, and the dielectric layer is patterned and etched to form at least one opening therein. At least one further conductive layer is deposited that at least fills the opening, and the conductor layer is polished to remove a portion of the conductor layer that extends outside the opening, thereby forming a word line structure connecting to the contact region that is at least partly atop of, but electrically isolated from, the bit line structure.

The foregoing aspects, features and advantages of the present invention will be further appreciated when considered with reference to the following description of the preferred embodiments and accompanying drawings.

BRIEF DESCRIPTION OF THE DRAWINGS

FIGS. 18A and 18B show cross-sectional views taken along lines A—A and B—B, respectively, and FIG. 18C shows a top view of a further process step in accordance with the invention.

FIGS. 21A and 21B show cross-sectional views taken along lines A—A and B—B, respectively, and FIG. 21C shows a top view of a further process step in accordance with the invention.

DETAILED DESCRIPTION

Figure 1A:
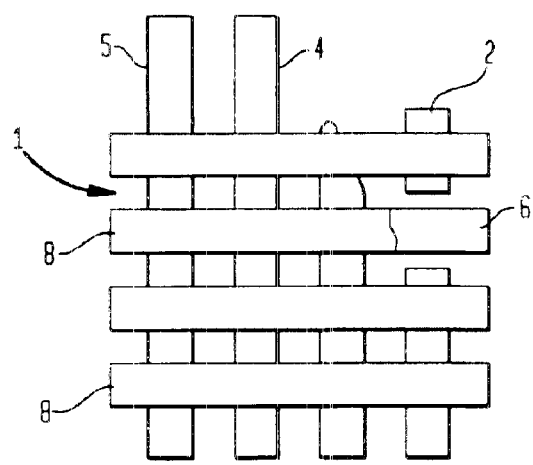
FIGS. 1A and 1B illustrate, in plan view, a known memory architecture.
Figure 1B:
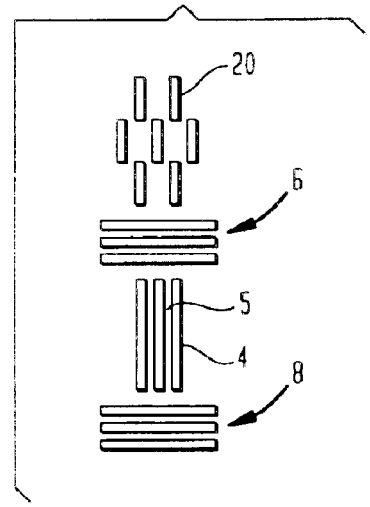

FIGS. 1A and 1B illustrate, in plan view, a known 8F2 DRAM memory cell array comprised of plural memory cells. Examples of such known 8F2 DRAM cells and processes for fabricating such DRAM cells are described in U.S. application Ser. No. 09/888,202, filed Jun. 22, 2001, the disclosure of which is incorporated herein by reference.

FIG. 1A shows various mask patterns of a known memory cell array superimposed on one another. FIG. 1B shows each mask pattern of FIG. 1A separately, namely FIG. 1B represents the view of FIG. 1A at four different depths. The topmost pattern of FIG. 1B illustrates an arrangement of a plurality of deep trenches 20. The second pattern from the top in FIG. 1B illustrates the arrangement of the known active areas in which doped junctions used for pass transistors are formed. The third pattern from the top illustrates the arrangement of the gate contact patterns or word lines of the cell array, and the bottom pattern illustrates the arrangement of the bit lines of the array.

As described above, the four patterns of FIG. 1B are shown in FIG. 1A superimposed atop one another to form the memory cell array 1. The array 1 is comprised of an arrangement of memory cells 2. Each cell 2 is contacted by two word lines 4 and 5 and by one bit line 8. The cell is comprised of an active area (AA) region 6 formed of silicon or polysilicon which is contacted by the bit line 8 which is comprised of a metal, such as tungsten or highly doped polysilicon. Each AA region 6 is electrically isolated from the next AA region by an isolation trench (IT) 10 which is preferably a trench filled with a field oxide.

The cell 2 is further comprised of a deep trench (DT) region 20 which form part of a trench capacitor and a vertical transistor. The deep trench also divides the AA regions 6. The bit line 8 contacts the AA region 6 on each side of the deep trench at a location where the AA region forms the drain of the pass transistor. The word line 4 passes between the AA regions 6 at a location above the deep trench regions, namely where the AA region is interrupted, to contact the gate of the vertical transistor formed within the trench.

Figure 1C:
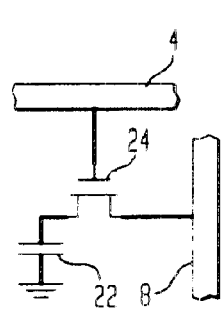
FIG. 1C shows a schematic diagram of a memory cell.

FIG. 1C is a schematic diagram of a known memory cell 2. The cell is comprised of a charge storage capacitor 22 having one plate tied to a reference voltage, which is typically ground or one-half of the bit line voltage, and having its other plate tied to the source of a pass transistor 24. The pass transistor 24 has a drain tied to bit line 6 and a gate tied to word line 4.

Figure 2:
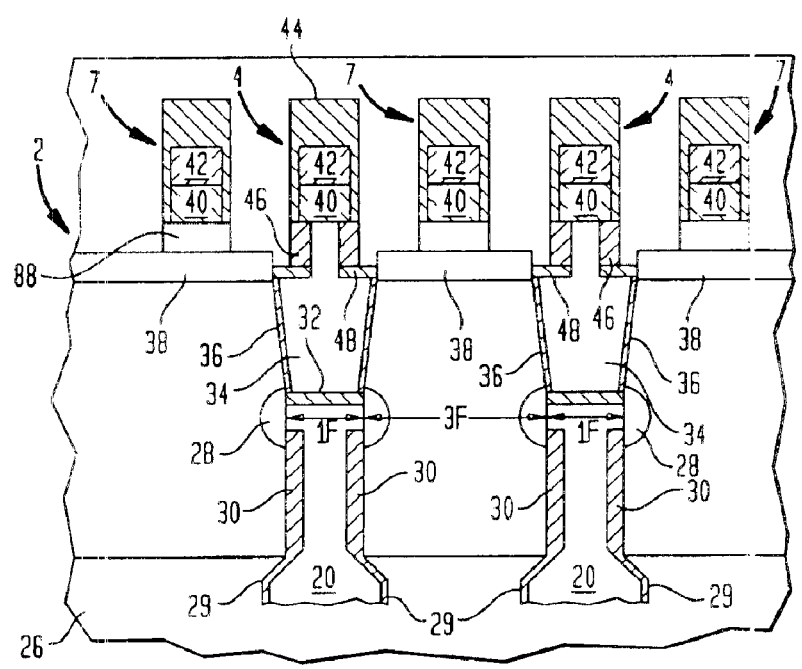
FIG. 2 shows a cross-sectional view of a known memory cell taken through the active region.

FIG. 2 is a cross-sectional view of a known memory cell 2 taken through the AA region 6 shown in FIG. 1. A charge storage capacitor 22 and a source of a pass transistor 24 are formed within the deep trench 20. The gate of the pass transistor 24 is formed within the upper region of the deep trench 20 above a trench top oxide (TTO). Drain regions for the pass transistor 24 are formed on both sides of the deep trench 20.

A buried plate or buried region 26 forms one plate of the capacitor 22. The buried plate 26 is typically a heavily doped region, preferably n-type, that is formed within a bulk p-type semiconductor substrate. Alternatively, the buried plate 26 is a p-type region formed within an n-type bulk substrate or formed within an n-type well formed within a p-type substrate. A thin dielectric layer 29, such as an oxide, a nitride layer, a combination of both, or another high-k material, is formed around the periphery of the deep trench 20 and forms the capacitor dielectric. Doped, preferably n-type polysilicon formed within the lower region of the deep trench 20 comprises the other plate of storage capacitor 22. The deep trench 20 also comprises a heavily doped buried strap region 28 which forms a first doped junction for the pass transistor 24, referred to herein as the source region. The buried strap is electrically connected to the n-doped polysilicon formed within the lower region of the deep trench 20, thus forming the connection between the pass transistor 24 and the charge storage capacitor 22. The deep trench 20 also preferably comprises a trench collar oxide 30 and a trench top oxide 32 for preventing parasitic current leakages.

In addition to the buried strap source region 28, the pass transistor 24 also includes a doped polysilicon gate region 34 formed within the upper region of the deep trench 20 and the gate oxide 36. The gate oxide 36 is formed on both sides around the polysilicon region 34 in the upper part of trench 20. The pass transistor also includes a drain region 38 which is formed on both sides of the trench as well. In this way, the overall gate width is doubled for a given gate length, because the transistor provides for two source-to-drain paths, one on each side of the deep trench. Each drain region 38 is connected to the bit line 8 (not shown in FIG. 2) via bit line contacts.

The gate polysilicon region 34 is contacted by an active word line (AWL) 4. Other word lines 7 are also shown in FIG. 2 which are connected to other memory cells, not shown, and which are referred to as passing word lines (PWL). The word lines 4 and 7 include a low resistance conductor layer atop an optional barrier layer, such as a dual layer conductor formed of a first tungsten nitride (WN) or polysilicon/WN layer 40 over which is formed a tungsten (W) or tungsten silicide (WSi) layer 42. The conductive layers are surrounded by a nitride insulating layer 44 to insulate the word lines from first metal (M0) contacts 80 and from the bit line. Additionally, the gate region 34 is insulated from its adjacent regions, such as the doped regions 38, by a spacer layer 46 and a cap layer 48. The spacer layer 46 is typically formed of an oxide layer, and the cap layer 48 is formed of a nitride layer, though other materials may be substituted. The passing word line 7 is insulated from the doped regions 38 by an array top oxide (ATO) 88.

Figure 3:
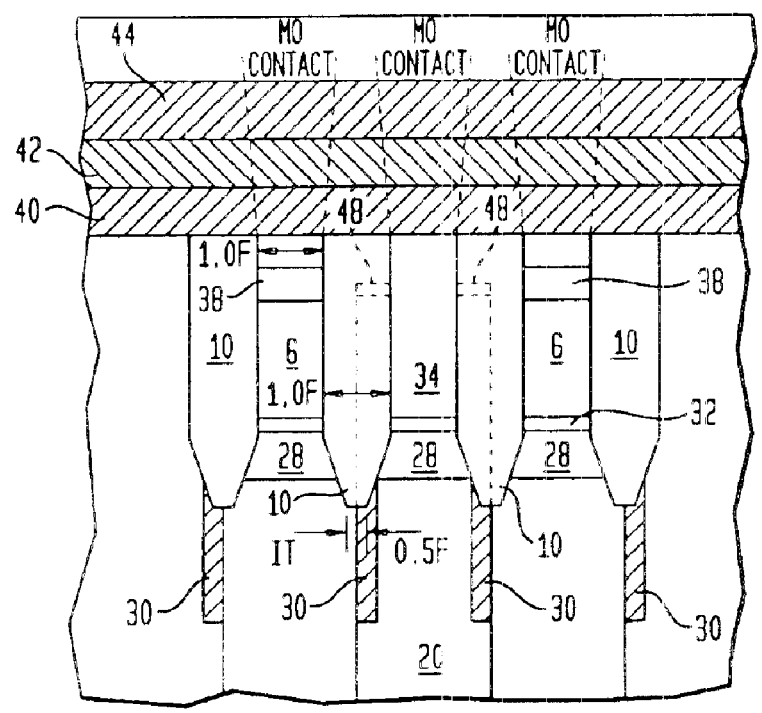
FIG. 3 shows a cross-sectional view of a known memory cell taken perpendicularly to the axis of the active region.

FIG. 3 depicts a cross-sectional view of the memory cell 2 taken perpendicular to the view of FIG. 2, i.e., along the passing word line 7. Four isolation trenches 10 are depicted. The isolation trenches are formed between the active regions 6 and separate the bit line contacts from one another. Traversing from left to right in FIG. 3, along word line 7, an isolation trench 10 is shown, followed by an active area region 6, another isolation trench 10, another active region 6, and so on.

The deep trench 20 is shown in FIG. 3 behind the active region 6 as is the trench collar oxide region 30. The buried strap region 28 is shown within the deep trench region of FIG. 3 but is actually out-diffused from the deep trench polysilicon region into the surrounding bulk region of active regions 6 in front of or behind the deep trenches. The trench top oxide region 32 is visible but is actually behind in the bulk silicon of the active regions 6. Similarly, the doped drain junction 38 is shown in FIG. 3 but is actually behind or in front of the cross-sectional view illustrated in FIG. 3. Although the nitride cap 48 together with the upper part of the trench 20 are illustrated in the IT region 10, the regions are actually etched away when the IT is etched. The gate oxide 36 is similarly disposed parallel to the plane of the paper in the perspective of FIG. 3 and would not ordinarily be visible in the actual cross section but is labeled here for context. The word line includes a polysilicon layer 40, a tungsten layer 42, and a nitride cap 44. Also shown in phantom line are the bit line contacts by which the bit line contacts the drain regions 38 of the pass transistor.

Referring back to FIG. 2, each cell is comprised of two transistors. Each of the transistors shares a common gate region 34, but has its own gate oxide 36, source or first doped junction region 28, and drain or second doped junction region 38. The arrangement could also be considered to be a single transistor, operating under a single control signal, but having its source, gate oxide, and drain physically separated into two distinct regions. The drain region 38 of each transistor includes two contacts 80 to the bit line 6. The logical pass transistor hence has four contacts to the bit line. Also, each pass transistor shares a common doped junction region 38, namely the drain region, with a neighboring transistor.

A process flow for forming the known memory cell is described with reference to FIGS. 4A through 4E, FIGS. 5A and 5B, and FIGS. 6A through 6I.

Figure 4A:
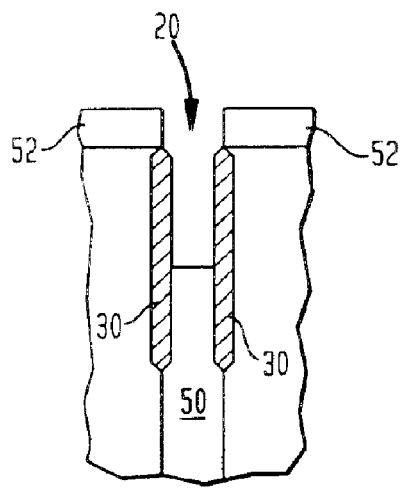
FIGS. 4A through 4E illustrate process steps for fabricating known memory cells and arrays.

First, a pad oxide layer (not shown) and a pad nitride layer 52 are deposited atop the substrate, and then a hard mask layer is deposited atop the nitride layer 52. The hard mask layer and the pad nitride layer are then patterned and etched using a lithographic step, and the hard mask layer is then used to mask the etching of the deep trench 20. Next, the hard mask layer is removed, and a doped glass layer is deposited along the walls and bottom of the trench as well as atop the nitride layer 52. A further lithographic step is then carried out to pattern and remove the doped glass from atop the nitride layer and from the walls of the upper portion of the trench. An oxide cap is then deposited over the remaining portion of the doped glass, as well as over the walls of the rest of the trench and atop the nitride layer, and a drive-in step is carried out to drive dopants from the doped glass and form a buried plate. The oxide cap and the doped glass are then removed, and the walls of the trench are lined with a node dielectric layer 29. The lower portion of the trench is then filled with polysilicon to form part of the polysilicon region 50, and the node dielectric is then removed from the part of the trench that is above the polysilicon. The top surface of the device is then planarized to remove any portion of the polysilicon that is atop the nitride layer, the trench collar oxide layer 30 is then deposited and etched back to remove any portion of the trench collar oxide layer that is atop the nitride layer 52, the remainder of the polysilicon layer 50 is next deposited, and the device is again planarized to remove any polysilicon that is atop the nitride layer 52. The nitride layer 52 protects the surrounding silicon during the polysilicon etch step. In FIG. 4A, a deep trench 20 and a trench collar oxide layer 30 are shown. The trench is shown filled with polysilicon 50 that has been recessed back to a desired level within the trench.

Figure 4B:
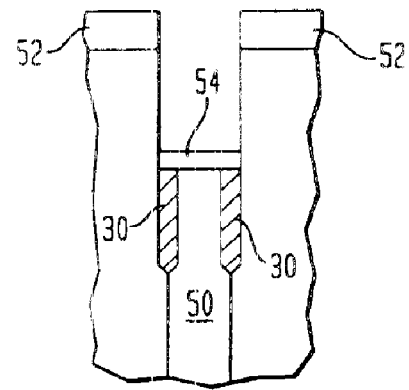

The trench collar oxide is recessed back as shown in FIG. 4B, preferably using a wet etch step. The oxide recess forms a divot at a location where the collar oxide is removed below the level of polysilicon fill 50. An optional thin oxidation or nitride deposition can also be performed. The divot is then filled by again filling the trench with polysilicon 54 and recessing the polysilicon 54 to the desired level. The polysilicon region 54 is subsequently doped in high temperature processing steps by the region 50 and the dopant subsequently out-diffuses into the substrate to form the buried strap region 28.

Figure 4C:
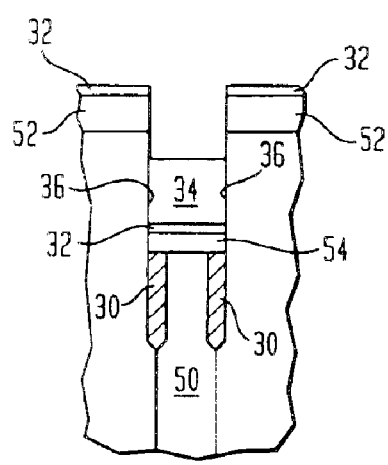

The trench top oxide 32 is formed, as FIG. 4C shows, by first forming a sacrificial oxide layer (not shown) on the sidewalls of the deep trench 20 above the region of polysilicon 54. The trench top oxide (TTO) layer 32 is then formed on the horizontal surfaces using a high density plasma (HDP) process followed by a wet etch. Optionally, a nitride wet etch can be performed to remove the overhang of the nitride layer 52 in the trench 20. After formation of the TTO layer 32, the sacrificial oxide layer is removed, thus providing a clean deep trench sidewall surface for subsequent growing of a gate oxide layer 36. After the gate oxide layer 36 is formed, a gate polysilicon layer 34 is deposited within the deep trench, polished by a CMP step and then recessed. Preferably, the deep trench is overfilled with polysilicon and is followed by a chemical mechanical polish (CMP) to the top of the nitride layer 52 or to the TTO layer 32. The polysilicon is then etched below the surface of the bulk silicon surrounding deep trench 20. The recess depth is a matter of design choice provided that the recess is within the junction depth of the drain 38 to insure junction to gate overlap.

Figure 4D:
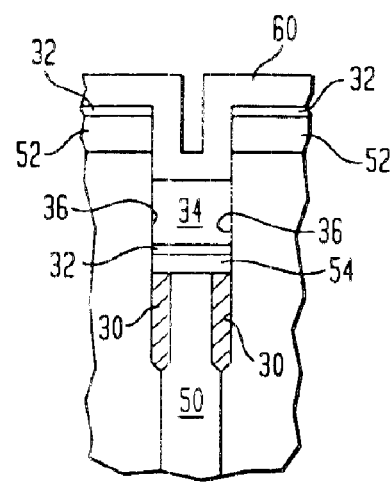

As shown in FIG. 4D, the exposed surfaces of the bulk silicon and of gate polysilicon 34 are then oxidized to form a thin oxide layer (not shown). A nitride liner 60 is formed.

Figure 4E:
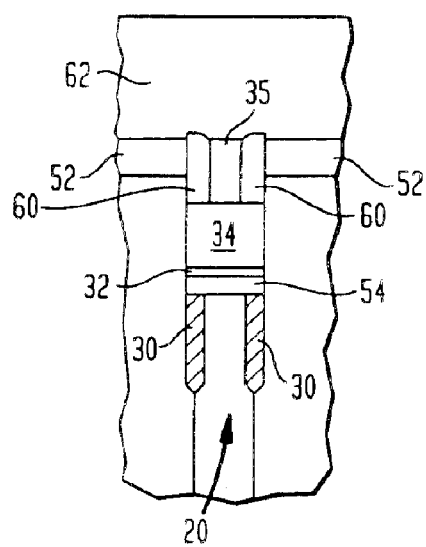

FIG. 4E illustrates a subsequent step in which the nitride liner 60 is etched back to form a nitride spacer. This step is followed by an oxide clean to remove any oxide from the exposed surface of gate polysilicon 34. The TTO layer 32 formed atop the nitride layer 52 may also be removed concurrently if not stripped earlier. Additional polysilicon is deposited atop the gate polysilicon region 34, resulting in a polysilicon stud 35 which is preferably integral with gate polysilicon 34. Preferably, the polysilicon stud layer 35 is overfilled and then wet etched back or alternatively subjected to a CMP planarizing step. A hard mask layer 62 is then deposited over the region to protect the trench during subsequent active area processing.

Figure 5A:
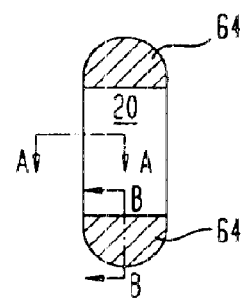
FIGS. 5A and 5B provide plan view detail of a deep trench formed in the active region of known memory cells.

FIG. 5A shows a top-down view of the deep trench 20 prior to the formation of an isolation trench (IT) 10. The deep trench 20 initially extends beyond the boundaries of overlying active area 6 and into what is to become part of the isolation trench region as shown by the crosshatched regions 64.

Figure 5B:
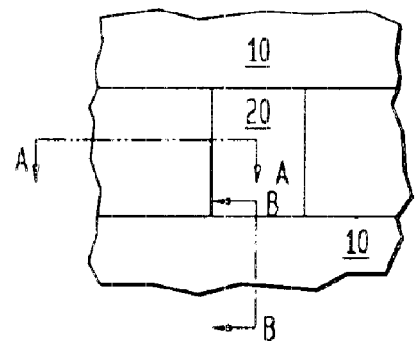

FIG. 5B illustrates the deep trench 20 after the isolation trench 10 is etched. The crosshatched regions 64 and the surrounding silicon have been etched away leaving an active region 6 and the deep trench 20 now bounded by the isolation trench 10 on both sides.

Lines A—A and B—B in FIGS. 5A and 5B define two cross-sectional perspectives provided in FIGS. 6A through 6I. The portion of FIGS. 6A through 6I to the left of the dotted vertical line is taken along the axis of bit line region, namely along the active area (AA) region, and corresponds to the perspective along line A—A in FIG. 5B. The portion of FIGS. 6A through 6I to the right of the dotted vertical line is taken perpendicular to the bit line region and corresponds to the perspective along line B—B in FIG. 5B.

Figure 6A:
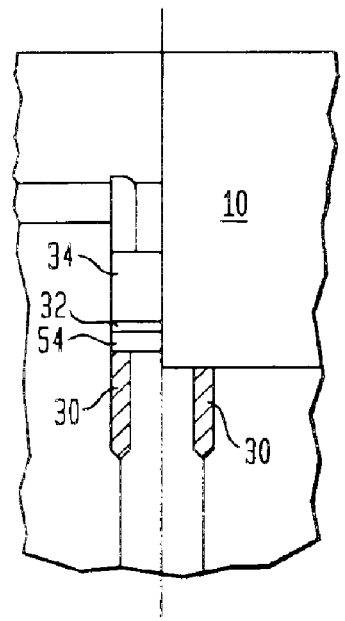
FIGS. 6A through 6I illustrate additional process steps for fabricating known memory cells and arrays.

As described above, the portion of the deep trench 20 underlying the bit line region is covered by the hard mask 62 before the isolation trench is etched. The portions lying outside the active regions and the surrounding silicon are exposed, as shown in FIG. 6A, including portions 64 of the deep trench. The exposed portion are etched, thereby forming the isolation trench 10 which truncates the upper and lower edges of the deep trench 20 by removing the regions 64 shown in FIG. 5A.

Figure 6B:
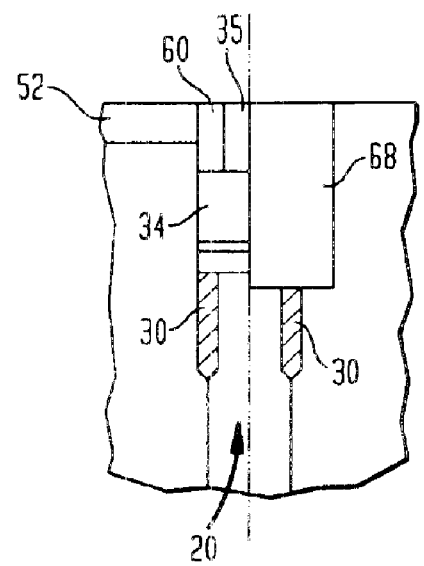

As illustrated in FIG. 6B, the isolation trench 10 is then filled with an insulating oxide 68 and then planarized. The hard mask 62 is then removed, and the trench oxide 68 and nitride spacer 60 are planarized to the top of nitride layer 52.

Figure 6C:
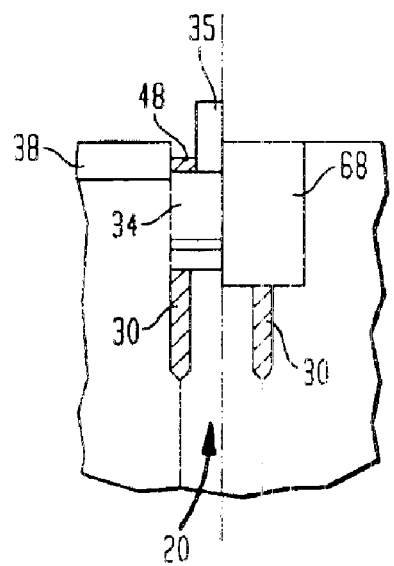

Referring to FIG. 6C, the nitride layer 52 and nitride spacer 60 are substantially removed to leave the nitride cap 48. The isolation trench oxide 68 is also partially etched back to remove any residual oxide layer on the nitride surface and may leave a gate polysilicon stud 35 which extends out above the surface of the nitride and oxide layers. A sacrificial oxide layer is then formed (not shown) and is followed by an ion implantation step to form the doped regions of the planar support circuits as well as the doped junction regions 38 of the vertical gate transistor 22. The sacrificial oxide layer is then removed prior to further processing. During each thermal step, such as the annealing step after the ion implantation step, the dopants within the polysilicon layer 54 in the trench diffuse out into the bulk silicon surrounding the trench to form the buried strap or doped junction 28 shown in FIG. 2.

Figure 6D:
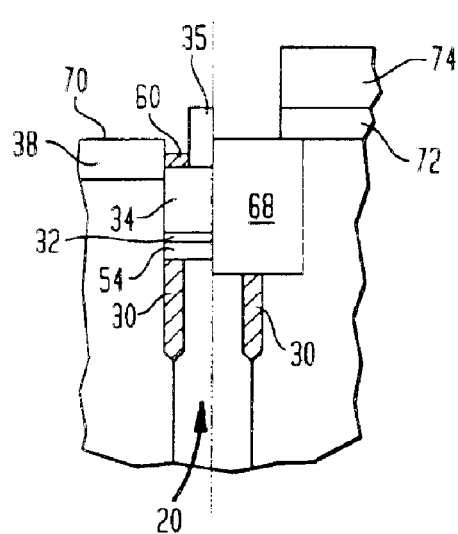

As shown in FIG. 6D, a planar device gate oxide 70 is then formed, and polysilicon layer 72 is then deposited to form the gate poly layer in the support. The polysilicon layer 72 is then patterned using known photolithographic and etching processes. An etch array (EA) mask pattern 74 exposes the active area and deep trench regions to the polysilicon etch while covering the support regions where planar devices are formed. The resulting polysilicon layer 72 covers only the support regions.

Figure 6E:
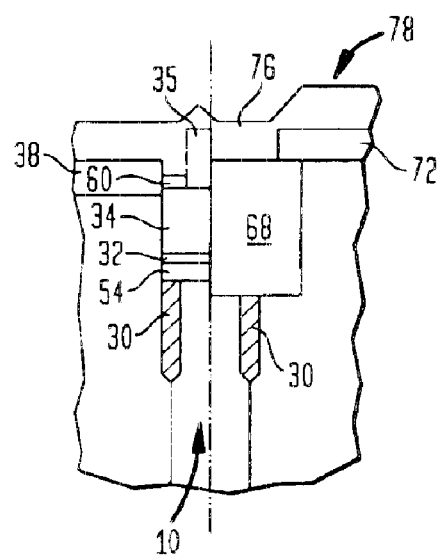

A thick oxide layer 76 is then deposited and patterned using an etch support (ES) mask layer 78, shown in FIG. 6E. The ES mask layer 78 covers the array regions and exposes the support regions so that the oxide layer 76 is etched away in the regions where the polysilicon layer 72 is present and remains only over the memory array areas, though there may be some overlap between the resulting polysilicon layer 72 and the thick oxide layer 76.

Figure 6F:
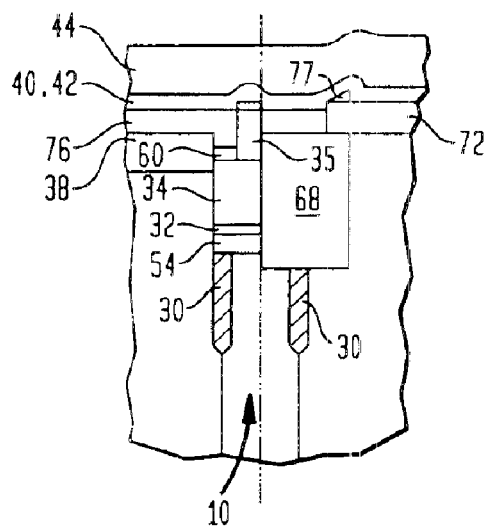

The thick oxide layer 76 is then planarized, resulting in a planar top oxide surface below the level of gate polysilicon stud 35 and the polysilicon layer 72, as shown in FIG. 6F. A portion 77 of the thick oxide layer 76 may remain atop the polysilicon layer 72 when the oxide layer 76 is not etched back entirely in the active regions but appreciably does not degrade performance or yield.

After planarizing the thick oxide layer 76, an oxide clean step is performed to remove any oxide that has been formed over the gate polysilicon 35 so that the word line conductor stack may be formed. The word lines are preferably a multi-layer stack formed of the polysilicon layer 40 and the tungsten layer 42, shown in FIG. 2. Alternatively, the conductors can be formed of a single layer or a combination of layers comprising polysilicon, tungsten, tungsten nitride, tungsten silicide, tantalum nitride, or other known alternatives. A nitride cap 44 is then formed over the conductor stack.

Figure 6G:
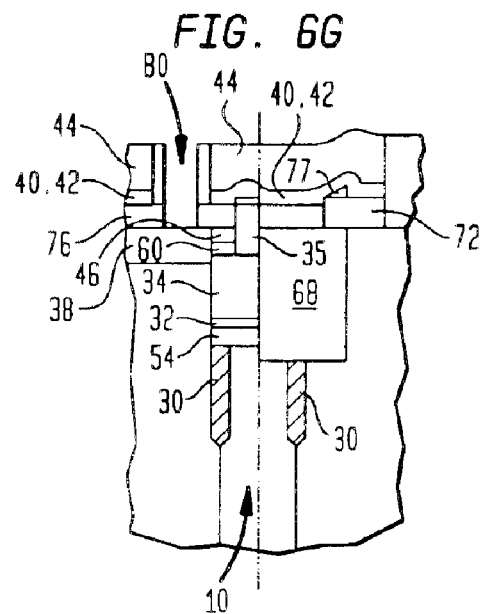

In FIG. 6G, the formation of the word line/support gate stack is illustrated. Oxide and nitride spacers are formed on the sides of the gate stack, and device implants are applied in the supports.

Figure 6H:
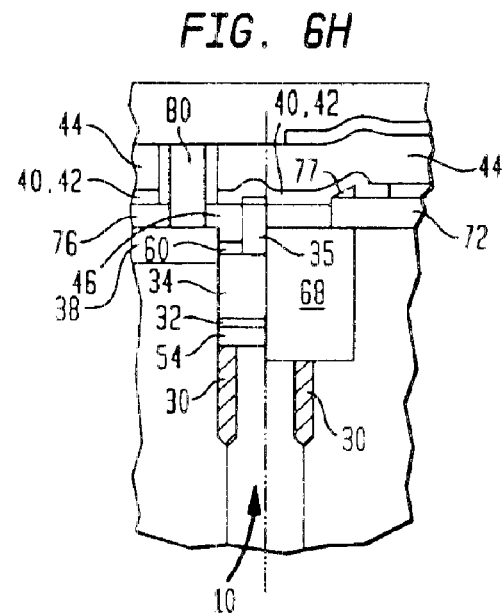

In FIG. 6H, the openings between the patterned gate stack are filled with a doped glass, and the surface is planarized to the top of the nitride layer 44 using a CMP step. A nitride layer is then deposited and opened over the array using a lithography step, and the nitride over the array is etched. An additional oxide layer is then deposited. Using an oxide-to-nitride selective etch, the bit line and the first support wiring are defined by a bit line (M0) mask step and then accordingly etched. In the support area, the etch stops on the nitride layer, whereas in the array for the bit lines, the etch reaches the drain region 38. The oxide spacer 46 and the nitride cap 60 prevent the bit line contact, and hence the bit line, from contacting the gate poly even when the M0 mask is misaligned.

Figure 6I:
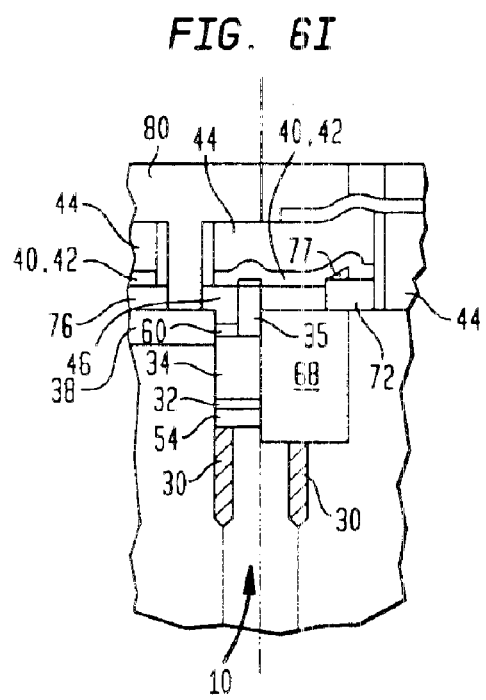

In FIG. 6I, the bit line and contact regions 80 are shown filled with a conductor. The bit lines may be formed of a single conductor layer or a combination of conductor layers.

The known process has the disadvantage that for smaller memory devices, the deep trench region 20 must be made very small to make room for the contact to the passing word line and to the bit line and contact regions 40. However, if the deep trench 20 is too small, it will not completely fill with polysilicon and voids will form therein. Thus, the etching step that forms the deep trench 20 is not easily controlled.

The known process has a further disadvantage when used for manufacturing smaller memory devices in that the trench collar oxide layer 30 must be formed using a buried collar etch. An additional disadvantage of the known process is that voids may occur in the insulating oxide 68 that fills the isolation trench 10 particularly at "triple-points" where the corner of the isolation trench 10, the bulk silicon 6 and the polysilicon inside the deep trench 20 meet, as shown in FIG. 3.

Yet another disadvantage of the known process is that two bit line contacts 40 are provided to the drain regions on each side of the deep trench 20 and cause a significant increase in the bit line capacitance.

The present invention addresses these problems by depositing and forming the bit line before the isolation trench is etched and before the word line is deposited and patterned. The bit line layout is used to mask isolation trench etching that defines the active areas. As a result, the active area is self-aligned to the bit line and maximizes the space available for the deep trenches and the bit line contacts.

Figure 7:
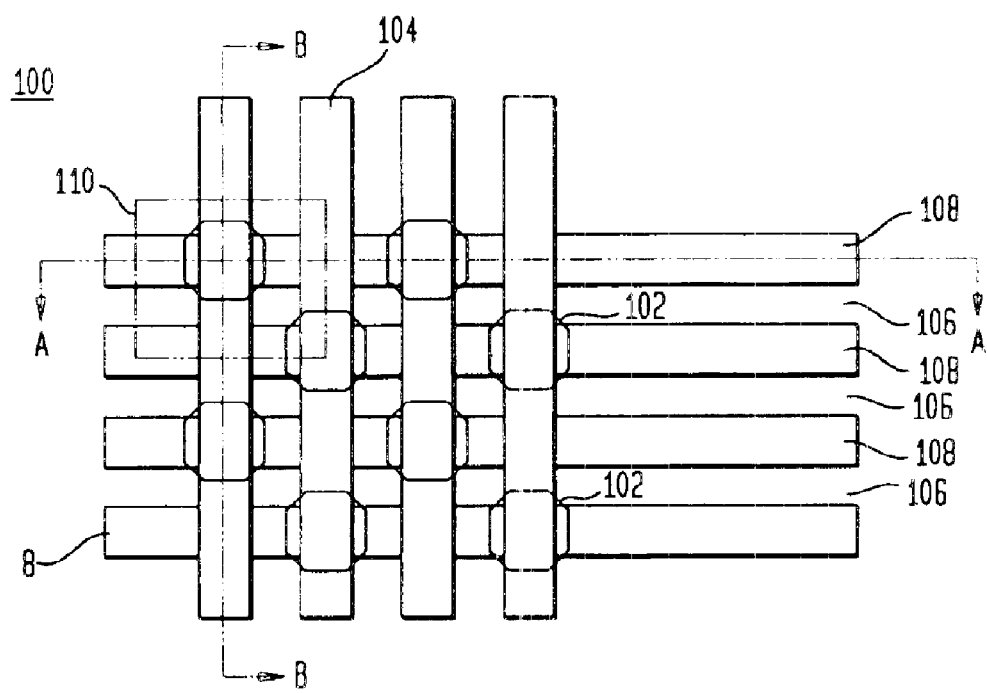
FIG. 7 illustrates, in plan view, a memory architecture in accordance with an embodiment of the invention.

FIG. 7 shows, in plan view, a memory cell array 100 formed in accordance with a process of the invention. A plurality of deep trench regions 102 are printed using a octagonal-shaped mask pattern, though other shaped deep trench regions are possible. The deep trenches are arranged in a "checkerboard" pattern.

A plurality of bit lines 108 contact the drain regions adjacent to the deep trenches and pass under the word lines 104. Isolation trench regions 106 are formed between the bit lines 108 and define active area regions located beneath the bit lines.

Figure 8A:
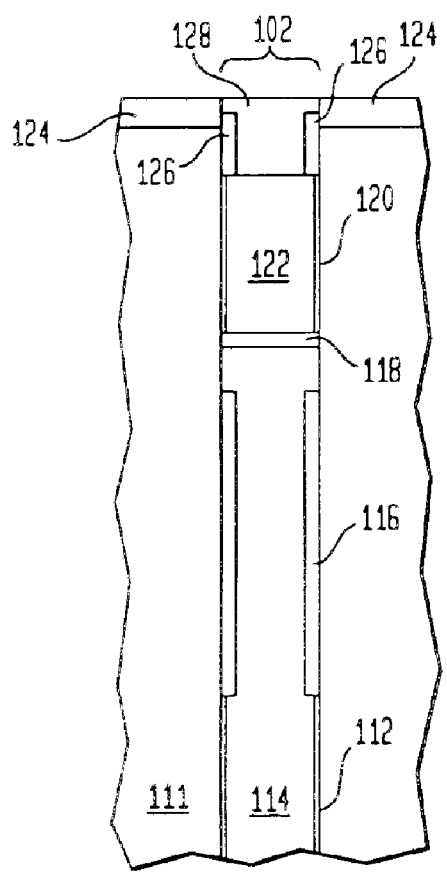
FIGS. 8A and 8B show cross-sectional views taken along lines A—A and B—B, respectively, of a process step in accordance with the invention.
Figure 8B:
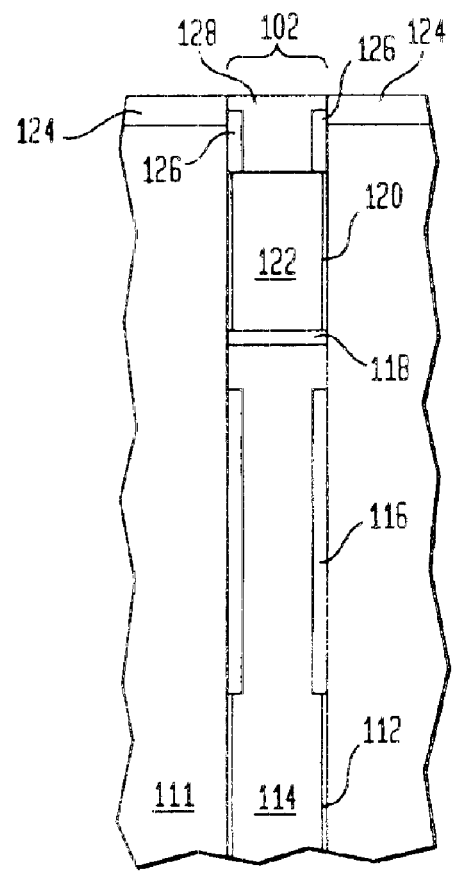

FIGS. 8A and 8B are cross-sectional views showing the region 110 of the memory cell array 100 in greater detail. FIG. 8A shows a cross-sectional view taken along line A—A of FIG. 7, namely taken along the bit line, and FIG. 8B shows a cross-sectional view taken along line B—B of FIG. 7 and is taken along the word line.

A deep trench 102 is formed within a semiconductor substrate 111. The lower portion of the walls of the deep trench 102 are lined with a node dielectric layer 112 and a collar oxide layer 116, and this portion of the trench is filled with doped polysilicon 114 which extends above the trench collar oxide layer 116 to contact the walls of the trench. The polysilicon 114 is topped with a trench top oxide (TTO) layer 118, and a gate oxide layer 120 is formed along the walls of an upper portion of the trench. A further polysilicon layer 122 fills all but the uppermost portion of the remainder of the deep trench 102 and forms a gate region. Nitride spacers 126 line the sidewalls of the uppermost portion of the trench, and another nitride layer 124 covers the top surface of the semiconductor substrate.

The above-described structure is formed in the known manner described above with reference to FIGS. 4A–4D. However, a top oxide plug region 128 is deposited to fill the uppermost portion of the deep trench 102 in place of the polysilicon stud 35 shown in FIG. 4E.

Figure 9A:
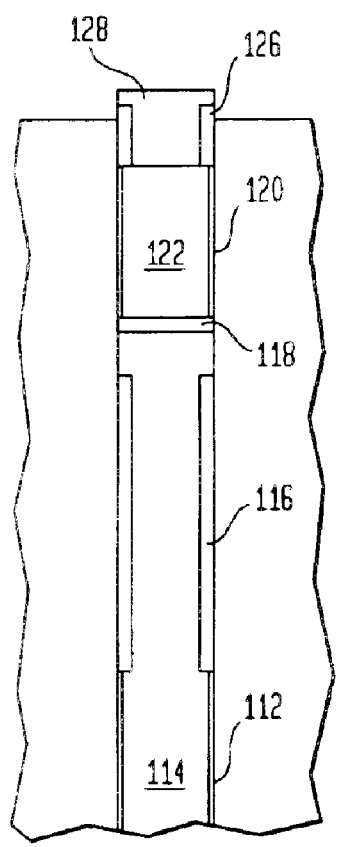
FIGS. 9A and 9B show cross-sectional views taken along lines A—A and B—B, respectively, of a further process step in accordance with the invention.
Figure 9B:
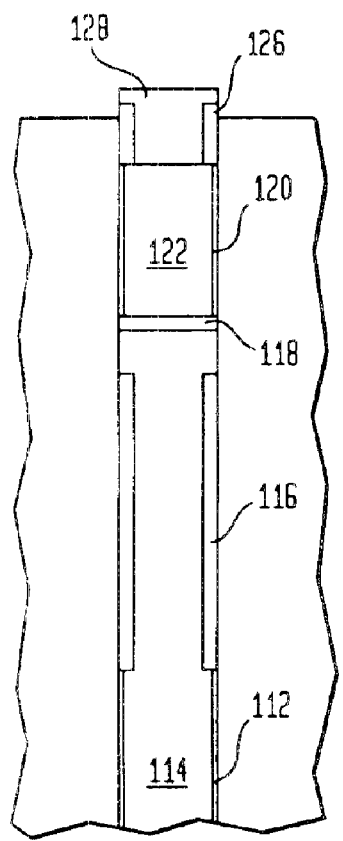

Next, as FIGS. 9A and 9B show, the nitride layer 124 is removed in a known manner. The nitride spacers 126, however, remain and are protected during the nitride removal by a portion of the top oxide plug 128 that extends above and over the nitride spacers as well as by a side oxide layer (not shown) formed prior to the spacer deposition.

Figure 10A:
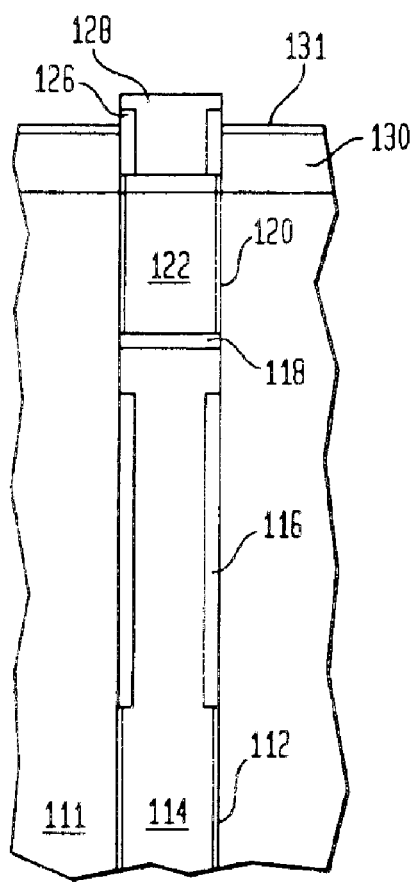
FIGS. 10A and 10B show cross-sectional views taken along lines A—A and B—B, respectively, of a further process step in accordance with the invention.
Figure 10B:
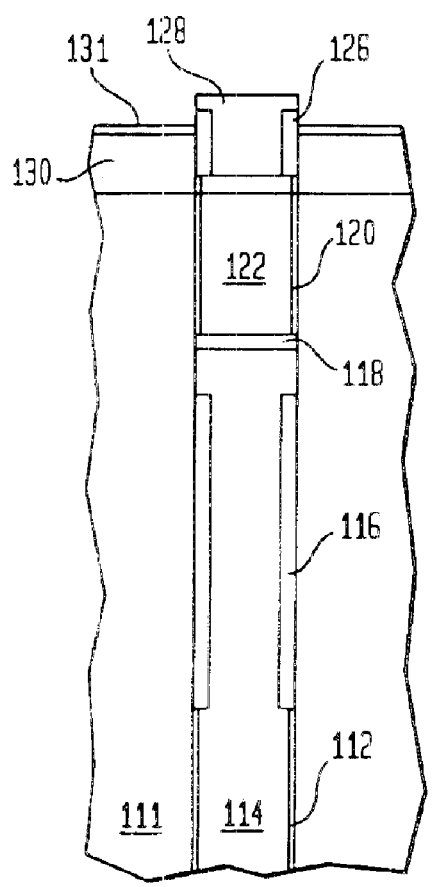

Then, as shown in FIGS. 10A and 10B, a protective thin oxide layer 131 is formed on the top surface of the substrate, and an n-type ion implant step is carried out to form doped regions 130. The thin oxide layer 131 is then removed.

Figure 11A:
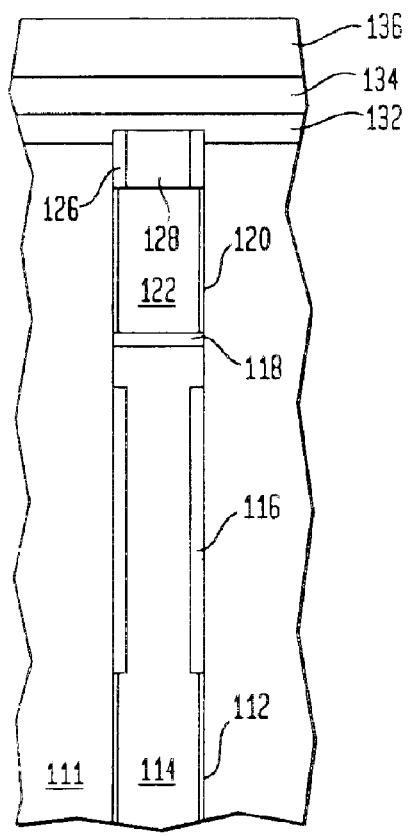
FIGS. 11A and 11B show cross-sectional views taken along lines A—A and B—B, respectively, of a further process step in accordance with the invention.
Figure 11B:
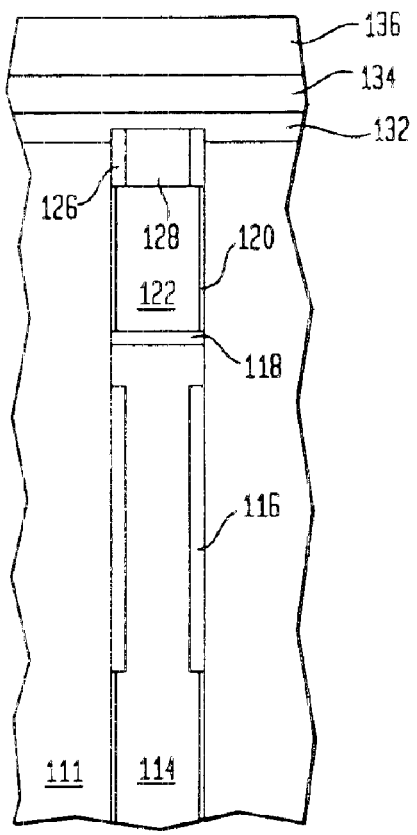

The layers that form the bit line stack are then deposited atop the silicon substrate, as FIGS. 11A and 11B show. First, a layer of polysilicon 132 is deposited atop the top surface of the substrate. Then, a thin layer of tungsten nitride (WN), not shown, is deposited atop the layer of polysilicon 132, and a layer of tungsten (W) 134 is deposited atop the WN layer. An insulating layer, such as a layer of silicon nitride 136, is then deposited atop the W layer 134 and serves as an insulator from the subsequently formed word line. Though a W layer is described herein, other refractory metals may be used in place of W and other interface layers may be used in place of WN.

Figure 12A:
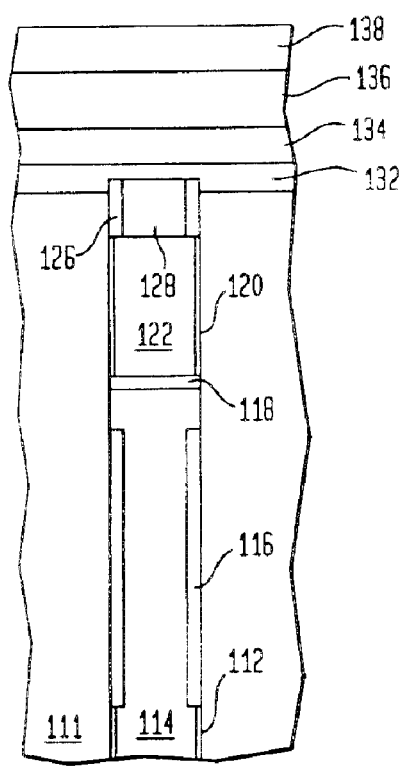
FIGS. 12A and 12B show cross-sectional views taken along lines A—A and B—B, respectively, of a further process step in accordance with the invention.
Figure 12B:
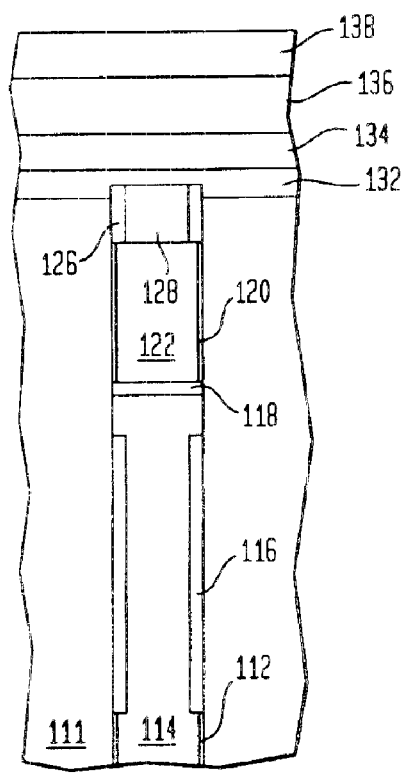

Next, as shown in FIGS. 12A and 12B, at least one hard mask layer 138 is deposited atop the silicon nitride layer 136. The hard mask layer or layers 138 is used to mask the subsequent isolation trench etching step.

Figure 13A:
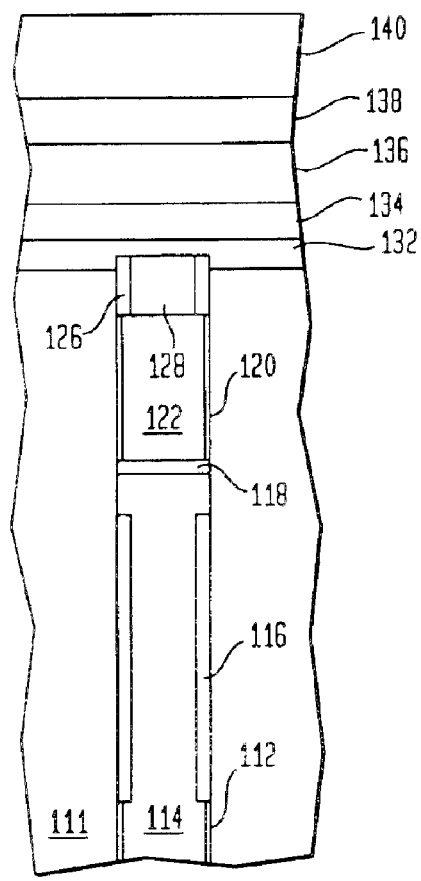
FIGS. 13A and 13B show cross-sectional views taken along lines A—A and B—B, respectively.
Figure 13B:
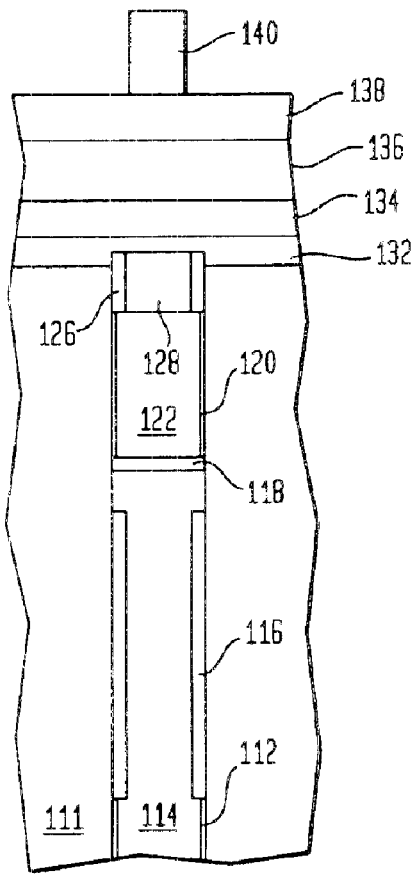
Figure 13C:
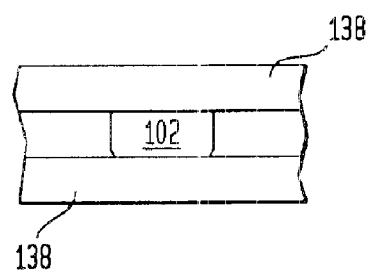
FIG. 13C shows a top view of a further process step in accordance with the invention.
Figure 14A:
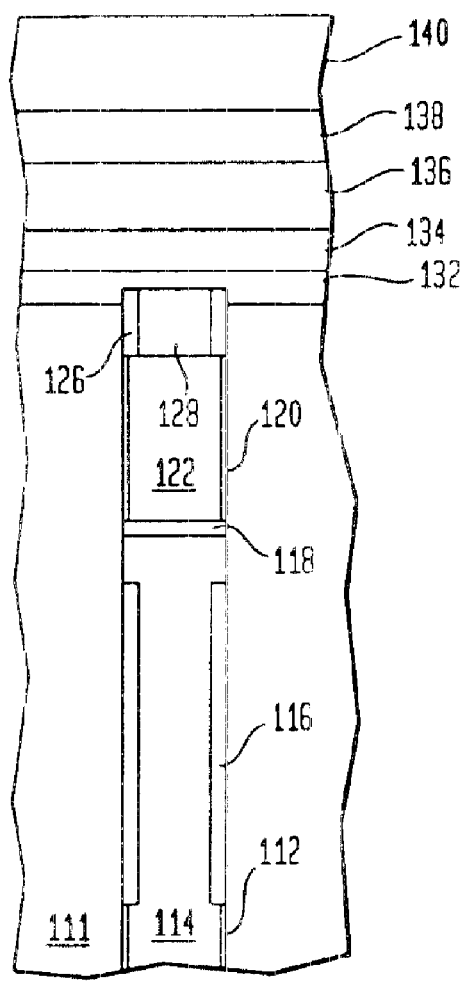
FIGS. 14A and 14B show cross-sectional views taken along lines A—A and B—B, respectively.
Figure 14B:
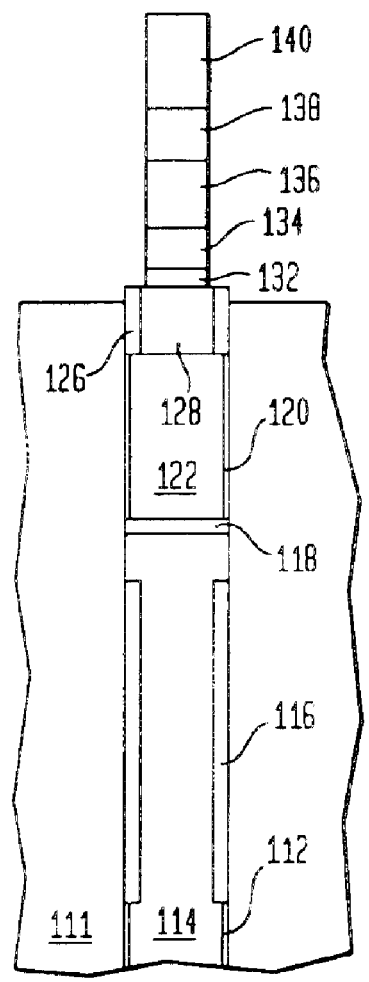
Figure 14C:
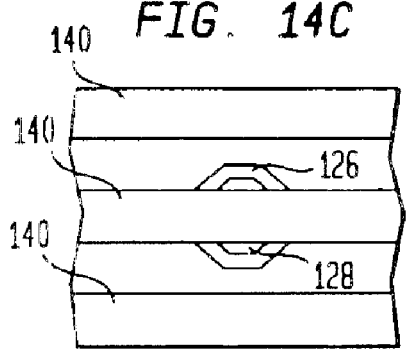
FIG. 14C shows a top view of a further process step in accordance with the invention.

FIGS. 13A and 13B show cross-sectional views along lines A—A and B—B, respectively, and FIG. 13C shows a top view of the region 110, shown in FIG. 7, of a further step in the process of the invention. A resist layer 140 is deposited atop the hard mask layer or layers 138 and is patterned using a known lithographic process. The patterned resist layer then serves as an etch mask for the etching of the hard mask layer or layers 138, the silicon nitride layer 136, the W layer 134, the WN layer, and the polysilicon layer 132, as FIGS. 14B and 14C show.

Figure 15A:
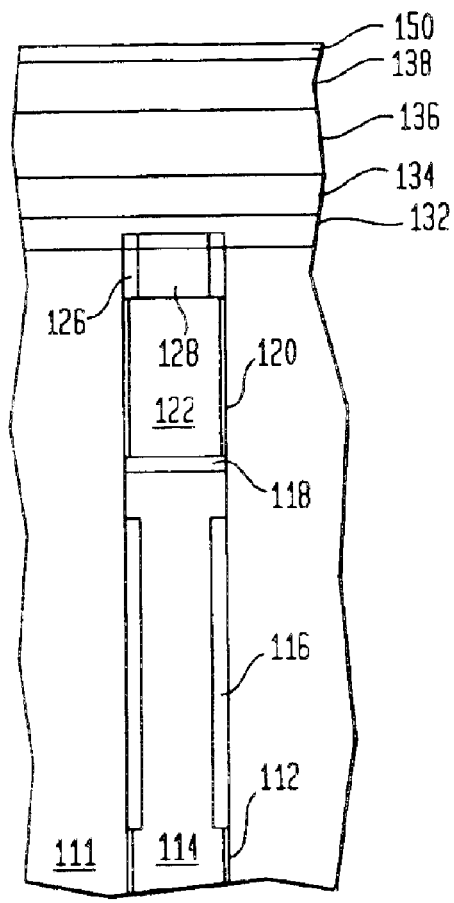
FIGS. 15A and 15B show cross-sectional views taken along lines A—A and B—B, respectively.
Figure 15B:
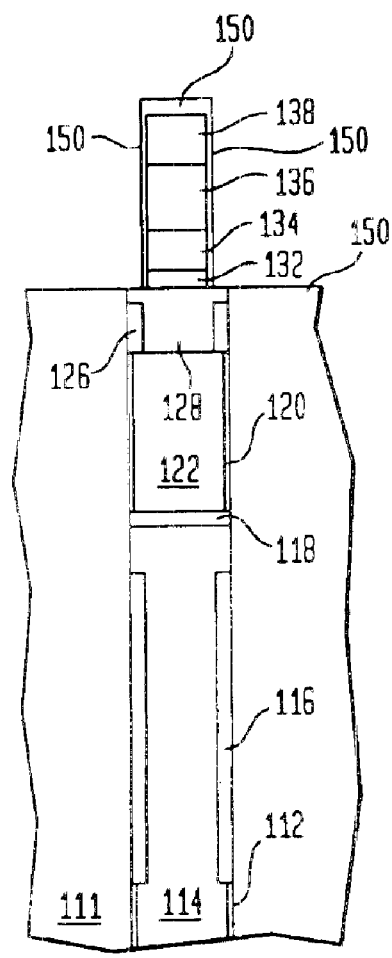
Figure 15C:
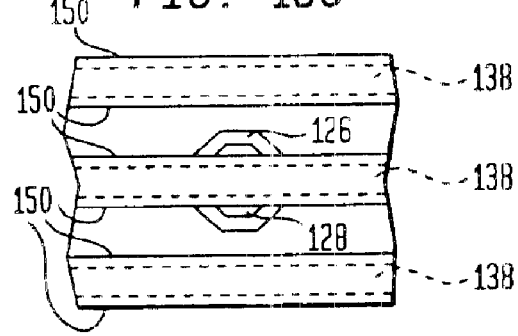
FIG. 15C shows a top view of a further process step in accordance with the invention.
Figure 16A:
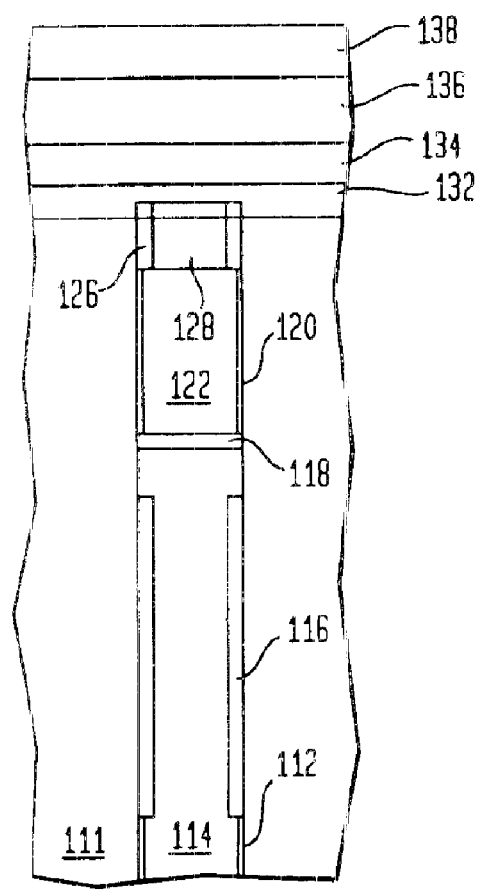
FIGS. 16A and 16B show cross-sectional views taken along lines A—A and B—B, respectively.
Figure 16B:
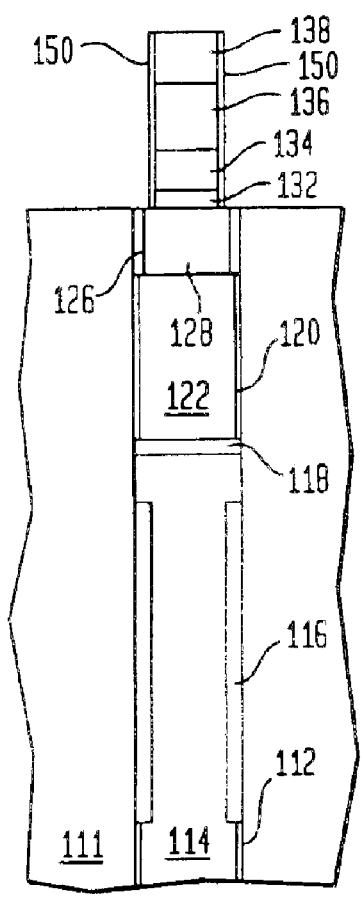
Figure 16C:
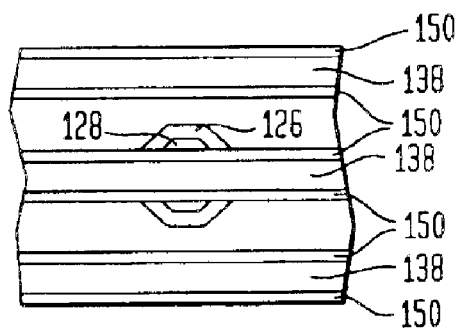
FIG. 16C shows a top view of a further process step in accordance with the invention.

The resist layer is then removed, as shown in FIGS. 15A–15C, and a thin layer of silicon nitride 150 is deposited atop the remaining portions of the hard mask layer or layers 138 and on the exposed portions of the semiconductor substrate as well as along the sidewalls of the hard mask/silicon nitride/W/WN/polysilicon bit line stack. The silicon nitride layer 150 is then subjected to an etch step that removes the silicon nitride from atop the hard mask layer or layers and the semiconductor substrate so that spacer portions remain only along the sidewalls of the bit line stack, as FIGS. 16A–16C show.

Figure 17A:
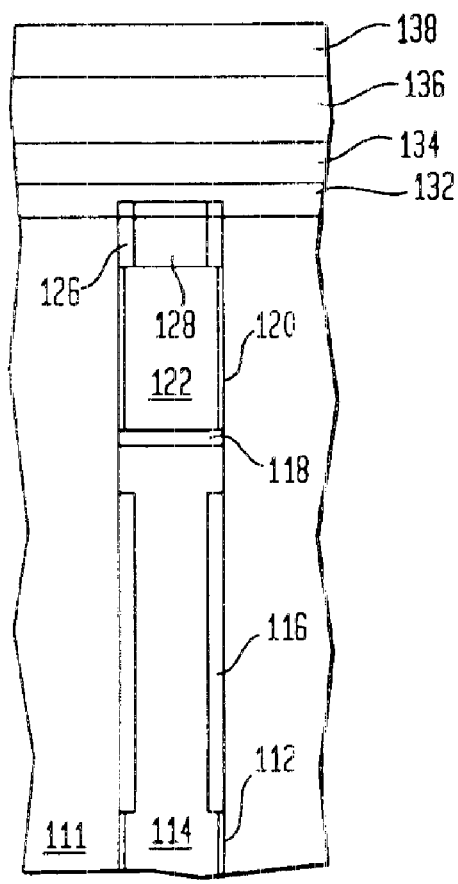
FIGS. 17A and 17B show cross-sectional views taken along lines A—A and B—B, respectively.
Figure 17B:
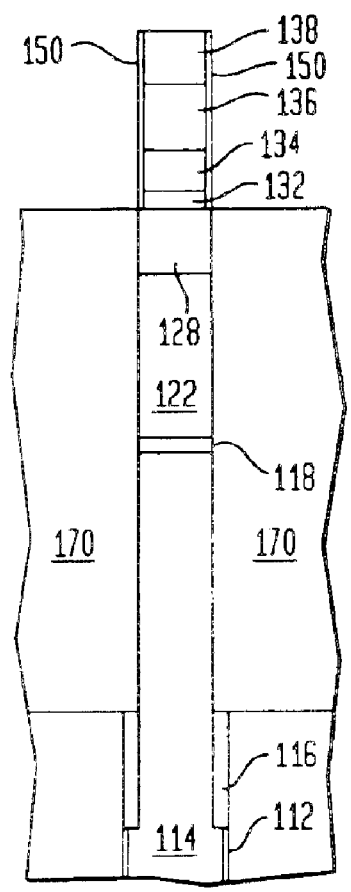
Figure 17C:
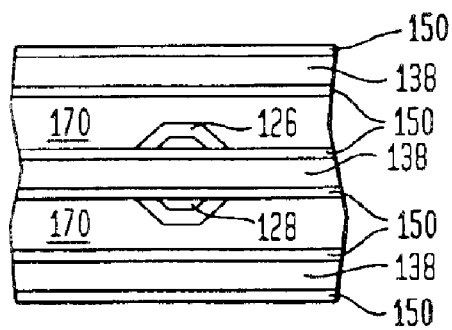
FIG. 17C shows a top view of a further process step in accordance with the invention.

Next, isolation trenches 170 are etched in the semiconductor substrate in the regions between the bit lines. The hard mask layer or layers 138 and the nitride spacers 150 serve as an etch mask, as FIGS. 17B and 17C show. Preferably, the isolation trench is etched using a reactive ion etch process or other plasma etch process in which the semiconductor substrate is etched with high selectivity with respect to the silicon oxide in the oxide plug 128, the gate oxide 120 and the collar oxide 116 so that there is no undercutting into the polysilicon regions 122 and 144, particularly at the "triple point" corners where the isolation trench, the semiconductor substrate and the polysilicon layers meet. As FIG. 17C shows, the oxide plug 126 shields the deep trench region 102 from being etched when the isolation trench is etched so that the deep trench protrudes outward from underneath the bit line stack.

Then, as FIGS. 18A–18C show, the hard mask layer or layers is removed, and the wafer is cleaned in preparation for an oxidation step. A thin oxide layer (not shown) is then grown along the outside of the active area regions along the walls of the isolation trenches 170. The trenches 170 are then filled with at least one oxide layer 180, such as a high density plasma (HDP) oxide, BPSG, other doped oxide, TEOS or a multi-layer oxide, that also extends above the tops of the isolation trenches to cover the bit line stack. The wafer is then planarized, such as using a chemical mechanical polishing (CMP) step, to reduce the top of the oxide 180 to the height of the bit line stack, as FIG. 18B shows.

Figure 19A:
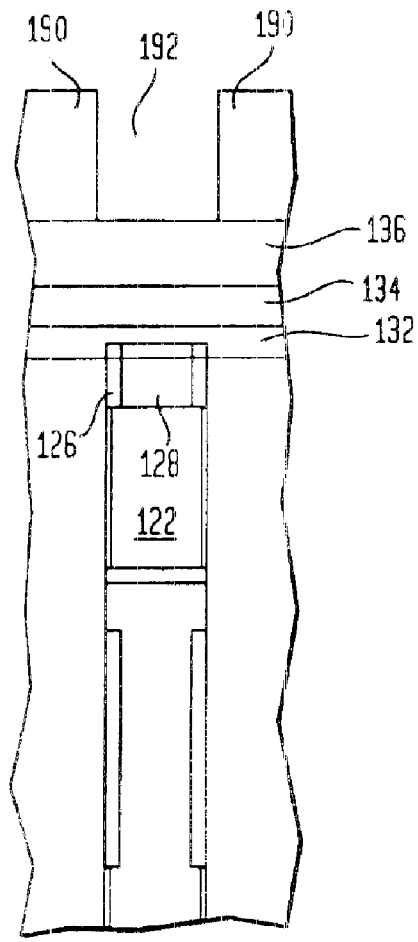
FIGS. 19A and 19B show cross-sectional views taken along lines A—A and B—B, respectively.
Figure 19B:
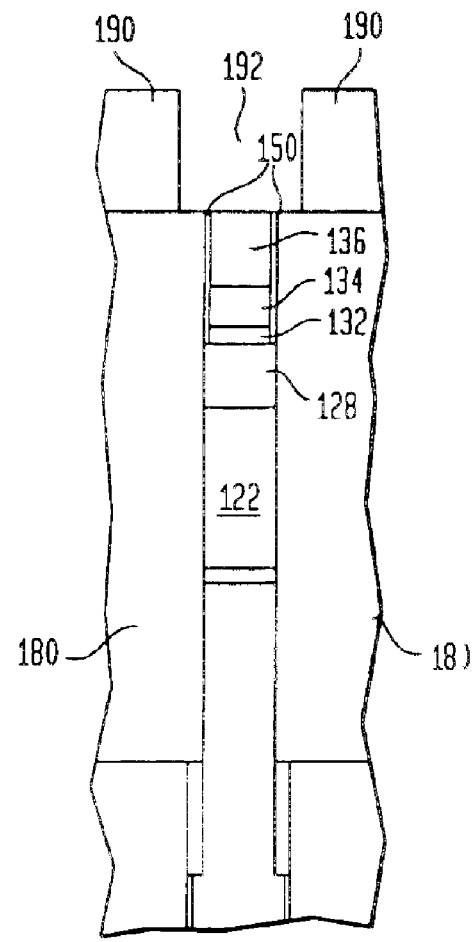
Figure 19C:
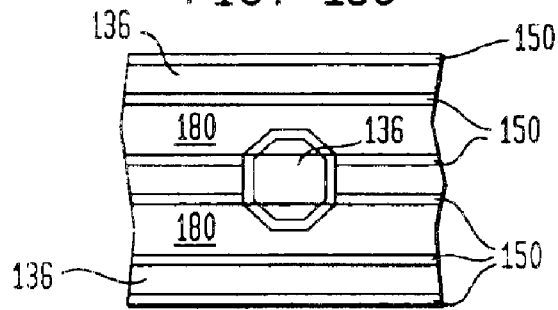
FIG. 19C shows a top view of a further process step in accordance with the invention.
Figure 20A:
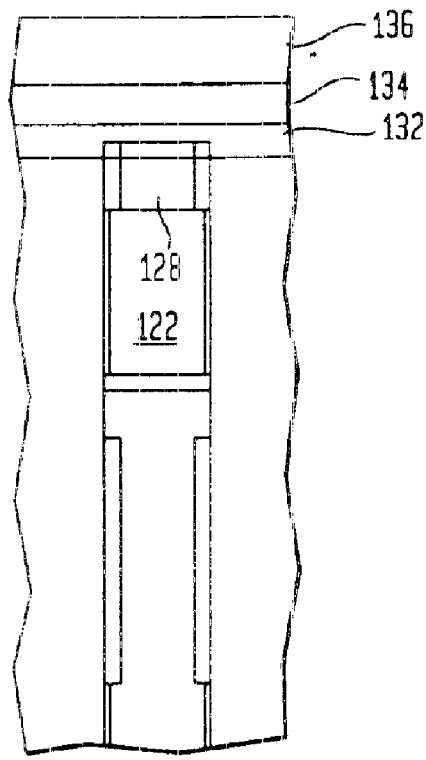
FIGS. 20A and 20B show cross-sectional views taken along lines A—A and B—B, respectively.
Figure 20B:
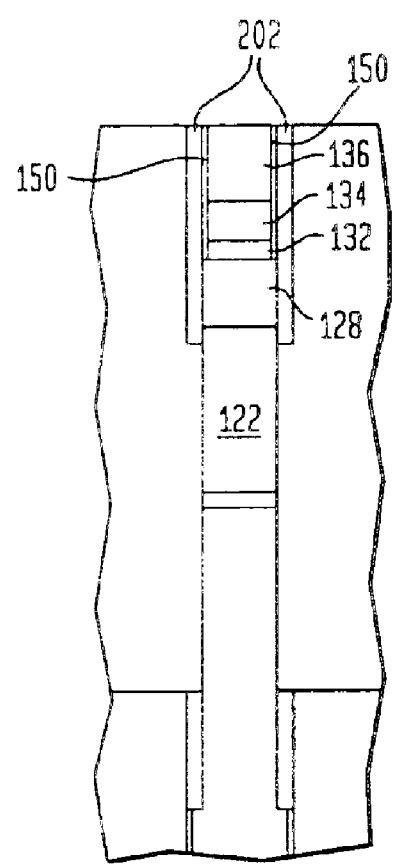
Figure 20C:
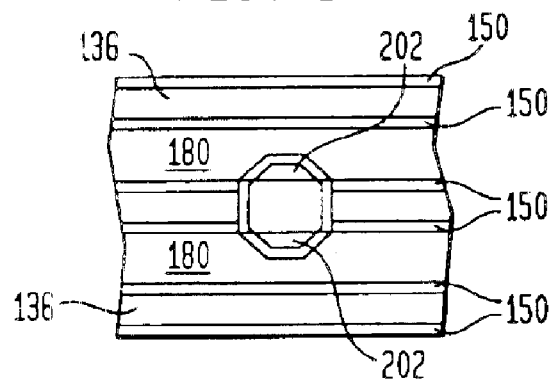
FIG. 20C shows a top view of a further process step in accordance with the invention.

Then, as shown in FIGS. 19A–19C, a resist layer 190 is deposited and patterned to form openings 192 that expose the top surface of the silicon nitride layer 136 and liner 150 of the bit line stack as well as portions of the oxide 180 that adjoin the bit line stack, as FIGS. 19B and 19C show. A selective etching step is then carried out that removes oxide, but does not etch silicon nitride, to etch into the exposed portions of the oxide 180 and form word line contact regions 202 that extend down to the gate polysilicon layer 122, as FIG. 20B shows. A layer of doped polysilicon is then deposited that fills the word line contact regions 202 and provide a conduction path to the gate polysilicon regions 122 for the subsequently deposited word lines. The doped polysilicon layer also covers the top surface of the silicon nitride layer 136 of the bit line stack as well as the top surface of the remaining oxide 180 and must be removed by a CMP step or other planarization step.

Next, as FIGS. 21A–21C show, one or more dielectric layers 212, such as BPSG, silicon nitride or TEOS, are deposited atop the top surface of the wafer and, typically, planarized. A resist layer (not shown) is then deposited and patterned to form openings to the dielectric layer 212, and the exposed portions of the dielectric layer 212 are removed to form openings that expose portions of the word line contact regions 202. The openings are then filled with W or other refractory metal to form the word lines 210 that contact the contact regions 202. The wafer is then planarized, such as using a CMP step, and then processing continues in the known manner.

The process of the invention has the advantage that the bit line stack, such as formed of layers 132, 134 and 136, is deposited and patterned prior to the etching of the isolation trenches and prior to the formation of the word lines. Passing word lines and deep trenches, which ordinarily limit the size of the bit line contacts, are therefore eliminated and allow for the formation of wider deep trenches which can be etched in a more controllable manner and filled more easily as well as allow for a higher deep trench capacitance.

As a further advantage, the bit line stack is formed before the etching of the isolation trenches and is used to mask the isolation trench etch. As a result, the active areas between the isolation trenches are self-aligned to the bit lines and provide optimal bit line contact to the active areas. Additionally, there is only one word line contact for each cell, thereby significantly reducing the bit line to word line capacitance.

Yet another advantage of the process of the invention is that a highly selective etch is used to form the active areas which reduces polysilicon undercutting to reduce the presence of voids at the "triple point" corners where the isolation trench, silicon and polysilicon layers meet.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a memory cell of a memory cell array comprised of a plurality of said memory cells arranged in rows and columns, said method comprising:

forming a deep trench structure within a semiconductor substrate, said deep trench structure including at least one conducting region;

forming a patterned bit line structure atop of, and electrically isolated from, said conducting region of said deep trench structure and atop of, but contacting at least part of, regions of said semiconductor substrate;

etching exposed portions of said semiconductor substrate to form at least one isolation trench adjoining said deep trench structure using said patterned bit line structure as an etch mask;

filling said isolation trench with a dielectric material;

forming, within said dielectric material of said isolation trench, a contact region to said conducting region of said deep trench structure that is electrically isolated from said bit line structure; and forming a word line structure that connects to said contact region and that is at least in part atop of, but electrically isolated from, said bit line structure.

2. The method of claim 1 wherein said step of forming a deep trench structure comprises:

forming a deep trench region within a semiconductor substrate;

forming a buried plate region within said semiconductor substrate adjacent to said deep trench region;

forming a dielectric film along sidewalls of the deep trench;

removing an upper region of said dielectric film such that a trench collar is formed along a middle portion of said deep trench region;

filling said deep trench region up to and at partially above said trench collar with doped polysilicon;

forming a trench top oxide layer atop said doped polysilicon;

forming a gate dielectric layer on a further portion of said sidewalls of said deep trench region;

filling a further portion of said deep trench region that is atop said trench top oxide layer with a further region of doped polysilicon; and filling a remaining portion of said deep trench region with at least one dielectric material.

3. The method of claim 1 wherein said deep trench structure includes an insulating region located in an uppermost portion of said deep trench structure, and said etching step includes using said insulating region of said deep trench structure as part of said etch mask.

4. The method of claim 1 further comprising forming a doped region in an upper portion of said semiconductor substrate adjacent to said deep trench, said doped region serving as a contact region for said bit line structure.

5. The method of claim 1 wherein said step of forming a patterned bit line structure comprises:

depositing at least one conductive layer atop said semiconductor substrate and atop said deep trench structure; and patterning and etching said conductive layer to form said patterned bit line structure.

6. The method of claim 5 wherein said step of forming a patterned bit line structure comprises depositing at least one hard mask layer atop said conductive layer and said patterning and etching step includes patterning and etching said hard mask layer.

7. The method of claim 1 wherein said patterned bit line structure comprises at least one of a layer polysilicon, a layer of tungsten nitride (WN), a layer of tungsten (W), and a layer of silicon nitride (SiN).

8. The method of claim 1 further comprising forming electrically insulating sidewall spacers on sidewalls of said bit line structure prior to said step of etching exposed portions of said semiconductor substrate, said contact regions being electrically isolated from said bit line structure by said sidewall spacers.

9. The method of claim 1 wherein said step of forming a contact region comprises:

patterning and etching a portion of said further dielectric material to form a contact opening to said further conducting region in said deep trench; and filling said contact openings with a conducting material to form said contact region.

10. The method of claim 9 wherein said conducting material comprises polysilicon.

11. The method of claim 1 wherein said step of forming a word line structure comprises:

depositing at least one dielectric layer atop said bit line structure;

planarizing a top surface of said dielectric layer;

patterning and etching said dielectric layer to form at least one opening therein;

depositing at least one conductive layer that at least fills said opening; and polishing said conductive layer to remove a portion of said conductor layer that extends outside said opening.

12. The method of claim 11 wherein said dielectric layer comprises at least one of a high density plasma (HDP) deposited oxide, TEOS, BPSG and a doped oxide.

13. The method of claim 1 wherein said word line structure comprises at least one of polysilicon, tungsten nitride (WN), tungsten (W), and tungsten silicide (WSi).

14. A method of forming a memory cell of a memory cell array comprised of a plurality of said memory cells arranged in rows and columns, said method comprising:

forming a deep trench region within a semiconductor substrate;

forming a buried plate region within said semiconductor substrate adjacent to said deep trench region;

forming a dielectric film along sidewalls of the deep trench region;

removing an upper region of said dielectric film such that a trench collar is formed along a middle portion of said deep trench region;

filling said deep trench region with doped polysilicon up to and partially above said trench collar;

forming a trench top oxide layer atop said doped polysilicon;

forming a gate dielectric layer on a further portion of said sidewalls of said deep trench region;

filling a further portion of said deep trench region that is atop said trench top oxide layer with a further region of doped polysilicon;

filling a remaining portion of said deep trench region with at least one dielectric material;

forming a doped region in an upper portion of said semiconductor substrate adjacent to said deep trench;

depositing at least one conductive layer atop said semiconductor substrate and atop said dielectric material in said deep trench;

patterning and etching said conductive layer to form at least one bit line structure that is atop of said dielectric material in said deep trench region and that is atop of, but contacting, at least part of said regions of said semiconductor substrate;

forming electrically insulating sidewall spacers on sidewalls of said bit line structure;

etching exposed portions of said semiconductor substrate to form at least one isolation trench adjoining said deep trench structure using said patterned bit line structure and using said dielectric material of said deep trench region as an etch mask;

filling said isolation trench with a further dielectric material;

patterning and etching a portion of said further dielectric material to form a contact opening to said further polysilicon region in said deep trench region;

filling said contact opening with a conducting material to form a contact region that is electrically isolated from said bit line structure by said sidewall spacers;

depositing at least one dielectric layer atop said bit line structure;

planarizing a top surface of said dielectric layer;

patterning and etching said dielectric layer to form at least one opening therein;

depositing at least one further conductive layer that at least fills said opening; and polishing said further conductive layer to remove a portion of said conductor layer that extends outside said opening, thereby forming a word line structure connecting to said contact region that is at least partly atop of, but electrically isolated from, said bit line structure.

15. A method of forming an interconnect structure of a memory cell array, said memory cell array being comprised of a plurality of memory cells arranged in rows and columns, each of said plurality of memory cells having a deep trench structure formed within a semiconductor substrate, said deep trench structure including at least one conducting region, said method comprising:

forming at least one bit line structure atop of a semiconductor substrate, said bit line structure having a portion contacting at least one bit line contact region of said semiconductor substrate; and thereafter forming at least one word line structure that is at least in part atop of, but electrically isolated from, said bit line structure, said word line structure connecting to at least one word line contact region, said word line contact region connecting to said conducting region of said deep trench structure.

16. The method of claim 15 wherein said bit line contact region comprises a doped region formed in an upper portion of said semiconductor substrate adjacent to said deep trench.

17. The method of claim 15 wherein said step of forming at least one bit line structure comprises:

depositing at least one conductive layer atop said semiconductor substrate and atop said deep trench structure; and patterning and etching said conductive layer to form said patterned bit line structure.

18. The method of claim 15 wherein said patterned bit line structure comprises at least one of a layer polysilicon, a layer of tungsten nitride (WN), a layer of tungsten (W), and a layer of silicon nitride (SiN).

19. The method of claim 15 further comprising forming electrically insulating sidewall spacers on sidewalls of said bit line structure.

20. The method of claim 15 wherein said step of forming at least one word line comprises:

etching exposed portions of said semiconductor substrate to form at least one isolation trench adjoining said deep trench structure using said bit line structure as an etch mask;

filling said isolation trench with a dielectric material;

forming, within said dielectric material of said isolation trench, said word line contact region; and forming said word line structure.

21. The method of claim 20 wherein said step of forming said word line structure comprises:

depositing at least one dielectric layer atop said bit line structure;

planarizing a top surface of said dielectric layer;

patterning and etching said dielectric layer to form at least one opening therein;

depositing at least one conductive layer that at least fills said opening; and polishing said conductive layer to remove a portion of said conductor layer that extends outside said opening.

22. The method of claim 15 wherein said word line structure comprises at least one of: polysilicon, tungsten nitride (WN), tungsten (W), and tungsten silicide (WSi).

* * * * *